(12) United States Patent
Yasutomi et al.

(10) Patent No.: US 9,585,279 B2
(45) Date of Patent: Feb. 28, 2017

(54) SEMICONDUCTOR DEVICE

(71) Applicant: Mitsubishi Electric Corporation, Tokyo (JP)

(72) Inventors: Goro Yasutomi, Fukuoka (JP); Yukimasa Hayashida, Fukuoka (JP); Ryutaro Date, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/655,011

(22) PCT Filed: Mar. 21, 2013

(86) PCT No.: PCT/JP2013/058048
§ 371 (c)(1),
(2) Date: Jun. 23, 2015

(87) PCT Pub. No.: WO2014/147787
PCT Pub. Date: Sep. 25, 2014

(65) Prior Publication Data
US 2015/0351276 A1    Dec. 3, 2015

(51) Int. Cl.
*H01L 23/053* (2006.01)
*H05K 7/14* (2006.01)
*H01L 23/049* (2006.01)
*H01L 23/498* (2006.01)

(52) U.S. Cl.
CPC ......... *H05K 7/1427* (2013.01); *H01L 23/049* (2013.01); *H01L 23/053* (2013.01); *H01L 23/49811* (2013.01); *H05K 7/1432* (2013.01); *H01L 2924/0002* (2013.01)

(58) Field of Classification Search
CPC .................................................. H01L 23/053
See application file for complete search history.

(56) References Cited

U.S. PATENT DOCUMENTS

| | | | |
|---|---|---|---|
| 2011/0069458 A1 | 3/2011 | Nakao et al. | |
| 2012/0218714 A1* | 8/2012 | Robert | H01L 23/053 |
| | | | 361/713 |
| 2013/0322025 A1* | 12/2013 | Shinkai | H01L 23/50 |
| | | | 361/728 |

(Continued)

FOREIGN PATENT DOCUMENTS

| | | |
|---|---|---|
| JP | 2009-081255 A | 4/2009 |
| JP | 2011-066255 A | 3/2011 |

(Continued)

OTHER PUBLICATIONS

International Search Report, PCT/JP2013/058048, Jun. 11, 2013.

(Continued)

*Primary Examiner* — Hung V Ngo
(74) *Attorney, Agent, or Firm* — Studebaker & Brackett PC

(57) ABSTRACT

An electrode (3) is joined to a wiring substrate (2). A nut box (7) is inserted in the bent portion (5) of the electrode (3) so that the nut (6) is positioned in alignment with the opening (4) of the electrode (3). A case (8) covers the wiring substrate (2). The nut box (7) and the case (8) are members separate from each other. The nut box (7) is fixed in the electrode (3) so as not to come off from the bent portion 5).

7 Claims, 6 Drawing Sheets

(56) References Cited

U.S. PATENT DOCUMENTS

| | | | | |
|---|---|---|---|---|
| 2014/0124936 | A1* | 5/2014 | Yanagawa | H01L 25/072 257/762 |
| 2014/0167237 | A1* | 6/2014 | Yoo | H01L 24/73 257/676 |
| 2014/0167239 | A1* | 6/2014 | Kim | H01L 23/49811 257/676 |
| 2014/0167241 | A1* | 6/2014 | Matsuoka | H01L 23/24 257/690 |
| 2014/0167242 | A1* | 6/2014 | Kim | H01L 23/053 257/690 |
| 2014/0299982 | A1* | 10/2014 | Minamio | H01L 25/162 257/712 |
| 2014/0370663 | A1* | 12/2014 | Bayerer | H01L 21/52 438/125 |
| 2015/0008570 | A1* | 1/2015 | Arai | H01L 23/49811 257/687 |
| 2015/0077943 | A1* | 3/2015 | Miyake | H01L 23/053 361/709 |
| 2015/0206860 | A1* | 7/2015 | Kontani | H02M 7/003 361/783 |
| 2015/0235965 | A1* | 8/2015 | Kodaira | H01L 23/544 438/118 |

FOREIGN PATENT DOCUMENTS

| | | |
|---|---|---|
| JP | 2011-228351 A | 11/2011 |
| KR | 1998-0045131 U | 9/1998 |
| KR | 10-2012-0017902 A | 2/2012 |
| WO | 2012/124209 A1 | 9/2012 |
| WO | 2013/015031 A1 | 1/2013 |

OTHER PUBLICATIONS

Written Opinion of the International Searching Authority, PCT/JP2013/058048, Jun. 11, 2013.

Notification of Transmittal of Translation of the International Preliminary Report on Patentability and Translation of Written Opinion of the International Searching Authority; PCT/JP2013/058048 issued on Oct. 1, 2015.

An Office Action issued by the Korean Patent Office on Aug. 26, 2016, which corresponds to Korean Patent Application No. 10-2015-7025707 and is related to U.S. Appl. No. 14/655,011; with English language translation.

* cited by examiner

SEMICONDUCTOR DEVICE

TECHNICAL FIELD

The present invention relates to a semiconductor device capable of improving the assembly efficiency and quality.

BACKGROUND ART

Conventionally, assembling for a product is performed in a state where the nuts are placed in a case. There is, therefore, a need to simultaneously connect the case and electrodes to a wiring substrate in a state where the electrodes are inserted in the case, or to attach the case after joining the electrodes.

CITATION LIST

Patent Literature

Patent Literature 1: Japanese Patent Laid-Open No. 2011-66255

SUMMARY OF INVENTION

Technical Problem

In a case where electrode joining and case attachment are simultaneously performed, however, the case is obstructive to cleaning and quality check of the electrode joint portions and reduces the facility with which the cleaning and the quality check are performed. In a case where case attachment is performed after electrode joining, the electrodes are bent after the case attachment and a fault such as a bent defect of the electrodes or a crack in the case resulting from stress caused in the case at the time of electrode bending is caused. Thus, there is a problem of the assembly efficiency and the quality being reduced.

A device for inserting a nut box in a bent portion of an electrode has been proposed (see, for example, Patent Literature 1). However, the nut box is not fixed on the electrode; the nut box comes off from the bent portion; and it was, therefore, impossible to improve the assembly efficiency.

The present invention has been achieved to solve the above-described problem, and an object of the present invention is to provide a semiconductor device capable of improving the assembly efficiency and quality.

Means for Solving the Problems

A semiconductor device according to the present invention includes: a wiring substrate; an electrode having an opening and a bent portion and joined to the wiring substrate; a nut box having a nut and inserted in the bent portion of the electrode so that the nut is positioned in alignment with the opening of the electrode.; and a case covering the wiring substrate, wherein the nut box and the case are members separate from each other, and the nut box is fixed in the electrode so as not to come off from the bent portion.

Advantageous Effects of Invention

The present invention makes it possible to improve the assembly efficiency and quality.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
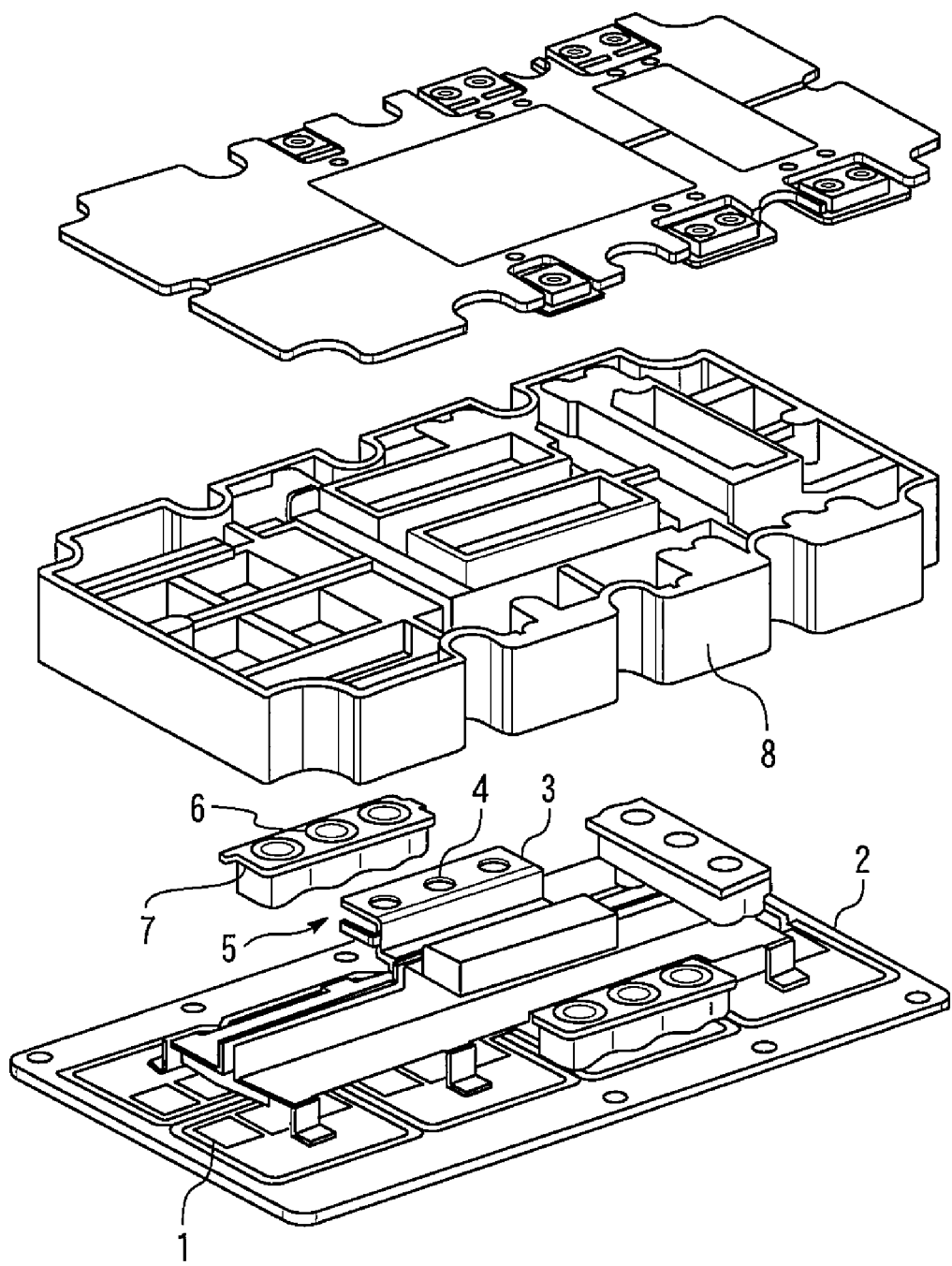
FIG. 1 is a perspective view of component parts in a separate state of a semiconductor device according to Embodiment 1 of the present invention.
Figure 2:
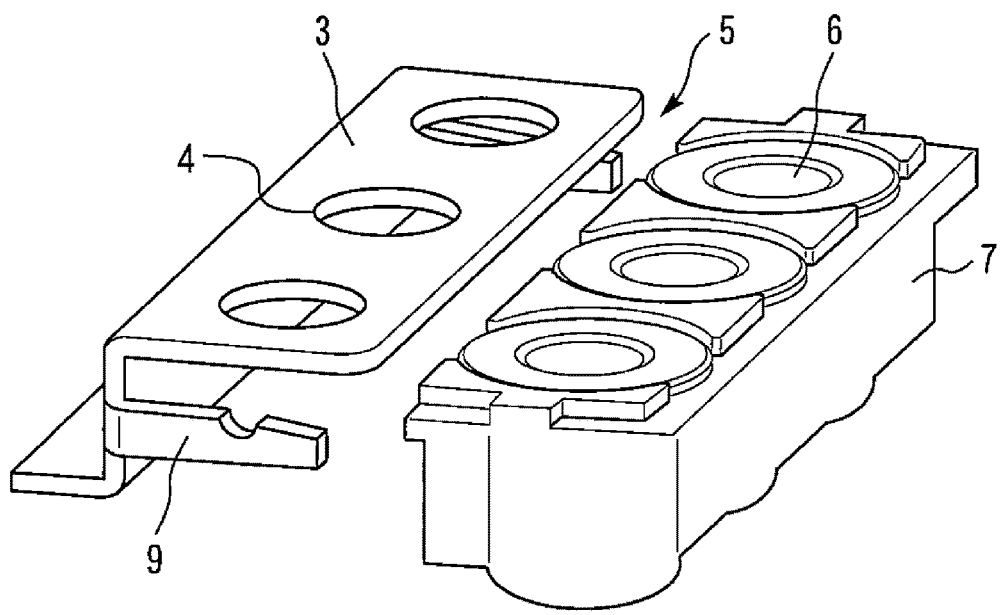
FIG. 2 is a perspective view showing insertion of a nut box in an electrode shown in FIG. 1.
Figure 3:
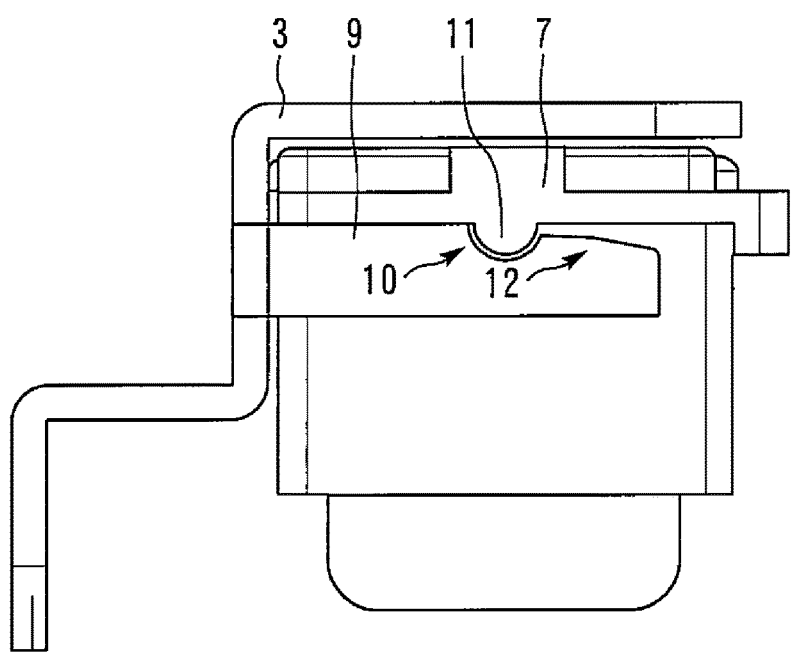
FIG. 3 is a side view showing a state where the nut box is inserted in the electrode.

FIG. 1 is a perspective view of component parts in a separate state of a semiconductor device according to Embodiment 1 of the present invention. FIG. 2 is a perspective view showing insertion of a nut box in an electrode shown in FIG. 1. FIG. 3 is a side view showing a state where the nut box is inserted in the electrode.

An electrode 3 is joined to a wiring substrate 2 on which a plurality of semiconductor elements 1 are mounted. The electrode 3 has openings 4 and a bent portion 5. A nut box 7 with nuts 6 is inserted in the bent portion 5 of the electrode 3. The nuts 6 in the nut box 7 are positioned in alignment with the openings 4 of the electrode 3. The electrode 3 is made of a metallic material for example. The nut box 7 is made of a resin material for example. A case 8 is attached to the wiring substrate 2 so as to cover the plurality of semiconductor elements 1 on the wiring substrate 2. The nut box 7 and the case 8 are members separate from each other.

The electrode 3 has a supporting portion 9 for supporting the nut box 7. An indentation 10 is provided in the supporting portion 9. On the other hand, the nut box 7 has a projection 11. The nut box 7 is fixed in the electrode 3 by fitting the projection 11 of the nut box 7 in the indentation 10 of the supporting portion 9. That is, the nut box 7 is fixed in the electrode 3 so as not to come off from the bent portion 5.

A lead 12 for leading the projection 11 of the nut box 7 into the indentation 10 is provided in the supporting portion 9. The lead 12 is a slope portion provided at the distal end of the supporting portion 9. The projection 11 touches this portion when the nut box 7 is inserted in the bent portion 5 of the electrode 3.

Figure 4:
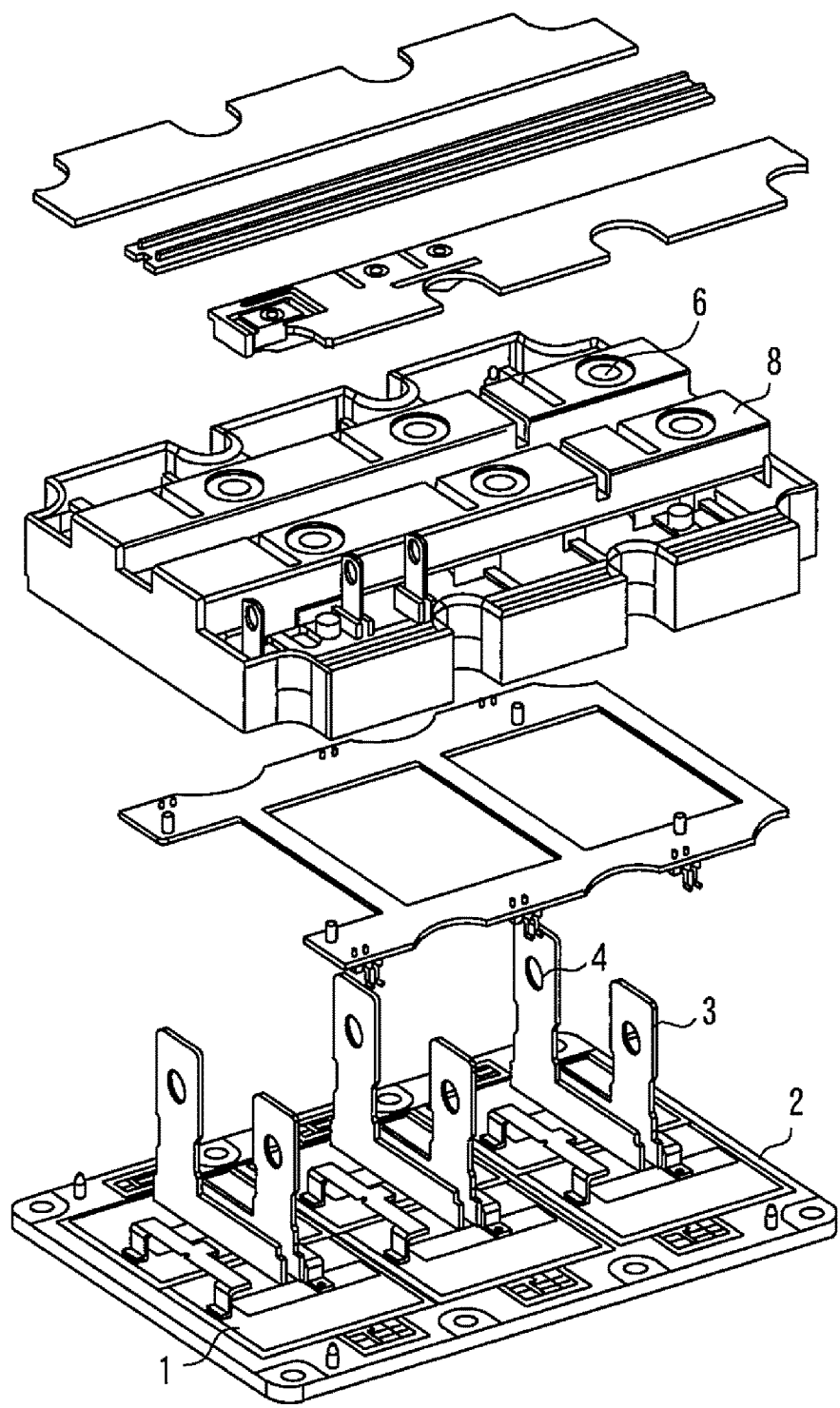
FIG. 4 is a perspective view of component parts in a separate state of a semiconductor device according to a comparative example.

The effects of the present embodiment will be described in comparison with a comparative example. FIG. 4 is a perspective view of component parts in a separate state of a semiconductor device according to a comparative example. In the comparative example, assembling for a product is performed in a state where the nuts 6 are placed in a case 8. There is, therefore, a need to simultaneously connect the case 8 and electrodes 3 to a wiring substrate 2 in a state where the electrodes 3 are inserted in the case 8, or to attach the case 8 after joining the electrodes 8.

In a case where electrode joining and case attachment are simultaneously performed, however, the case 8 is obstructive to cleaning and quality check of the electrode 3 joint portions and reduces the facility with which the cleaning and the quality check are performed. In a case where case attachment is performed after electrode joining, the electrodes 3 are bent after the case attachment and a fault such as a bent defect of the electrodes 3 or a crack in the case 8 resulting from stress caused in the case 8 at the time of electrode bending is caused. Thus, there is a problem of the assembly efficiency and the quality being reduced.

In contrast to this, in the present embodiment, the process step of attaching the electrodes to the wiring substrate 2 and the process step of attaching the case 8 to the wiring substrate 2 can be prepared separately from each other. Therefore, it is not necessary that the case 8 be in the state of being attached to the wiring substrate 2 when cleaning and quality check are performed after the electrodes 3 are joined to the wiring substrate 2, thus avoiding reducing the facility with which cleaning and quality check are performed. Also, since the nut box 7 is fixed in the electrode 3, it does not come off from the bent portion 5 at the time of assembly and at the time of use of the product. Thus, the assembly efficiency is improved. Since there is no need to bend the electrodes 3 after attachment of the case, no bent defect of the electrodes 3 and no crack are caused and an improvement quality is achieved.

The provision of the lead 12 in the supporting portion 9 improves the facility with which the nut box 7 is inserted in the bent portion 5 of the electrode 3, thereby achieving a further improvement in assembly efficiency.

Embodiment 2

Figure 5:
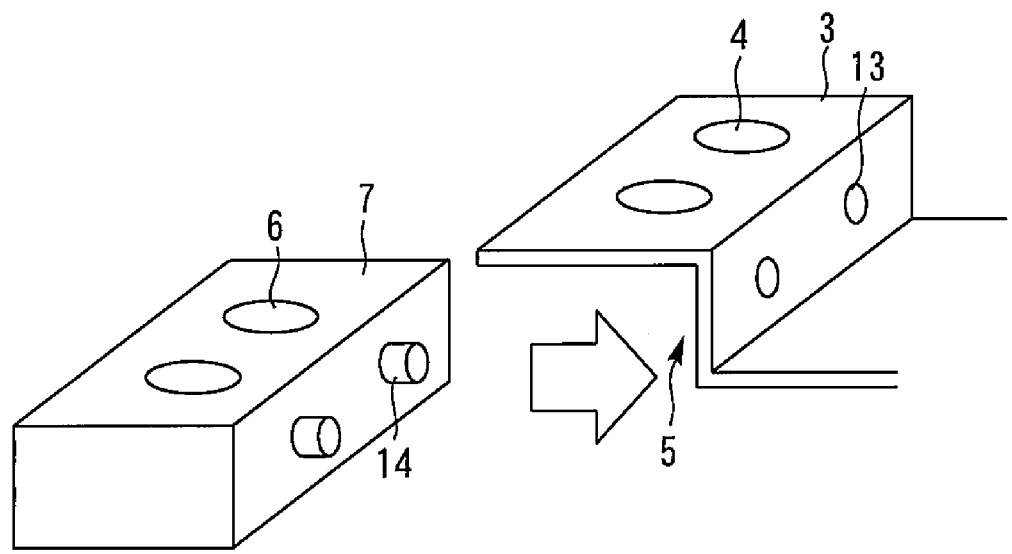
FIG. 5 is a perspective view of an electrode and a nut box according to Embodiment 2 of the present invention.

FIG. 5 is a perspective view of an electrode and a nut box according to Embodiment 2 of the present invention. The electrode 3 has holes 13. The nut box 7 has projections 14. The projections 14 of the nut box 7 are inserted in the holes 13 in the electrode 3 and molten and fixed on the electrode 3. By this melting and fixing, the force for holding the nut box 7 is improved. In other respects, the construction and effects are the same as those of Embodiment 1.

Embodiment 3

Figure 6:
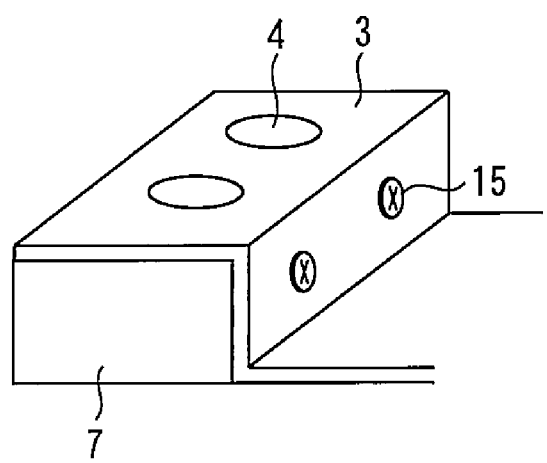
FIG. 6 is a perspective view of an electrode and a nut box according to Embodiment 3 of the present invention.

FIG. 6 is a perspective view of an electrode and a nut box according to Embodiment 3 of the present invention. The nut box 7 is fixed on the electrode 3 with metal screws 15. The force for holding the nut box 7 can thereby be improved. If resin crews are used in place of the metal screws 15, an increased insulating characteristic can be achieved. If snap-fits are used in place of the metal screws 15, the facility of assembly is improved. In other respects, the construction and effects are the same as those of Embodiment 1.

Embodiment 4

Figure 7:
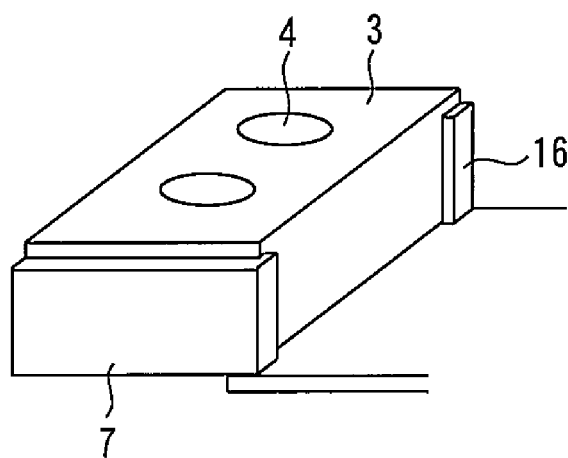
FIG. 7 is a perspective view of an electrode and a nut box according to Embodiment 4 of the present invention.
Figure 8:
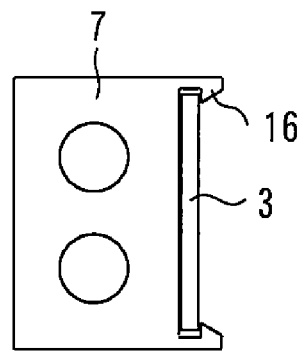
FIG. 8 is a sectional view of the electrode and the nut box seen from above.

FIG. 7 is a perspective view of an electrode and a nut box according to Embodiment 4 of the present invention. FIG. 8 is a sectional view of the electrode and the nut box seen from above. The nut box 7 has claws 16. When the nut box 7 is inserted in the bent portion 5 of the electrode 3, the claws 16 are deformed and the nut box 7 is fixed on the electrode 3 by reforming the claws 16 into the original shape after the insertion. The need for a special structure on the electrode 3 side is thereby eliminated and the facility with which the electrodes 3 is worked is therefore improved. In other respects, the construction and effects are the same as those of Embodiment 1.

Embodiment 5

Figure 9:
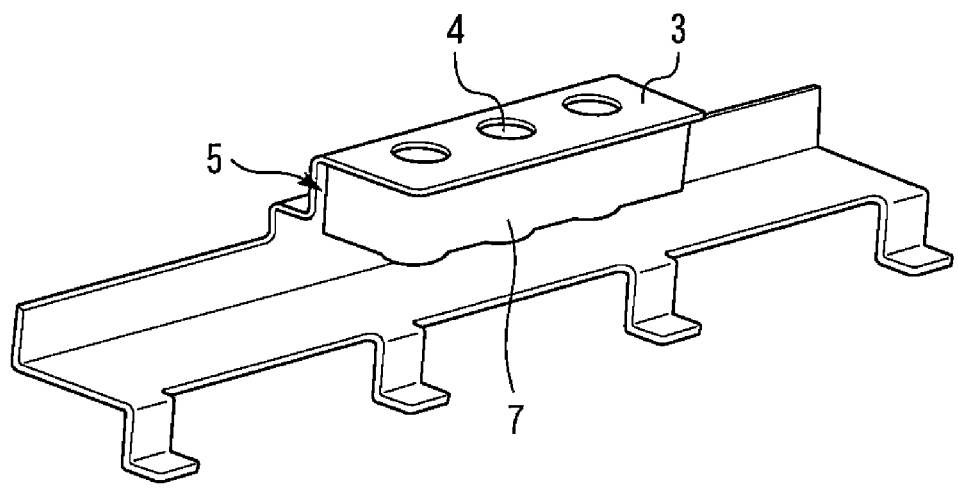
FIGS. 9 and 10 are perspective views of an electrode and a nut box according to Embodiment 5 of the present invention.
Figure 10:
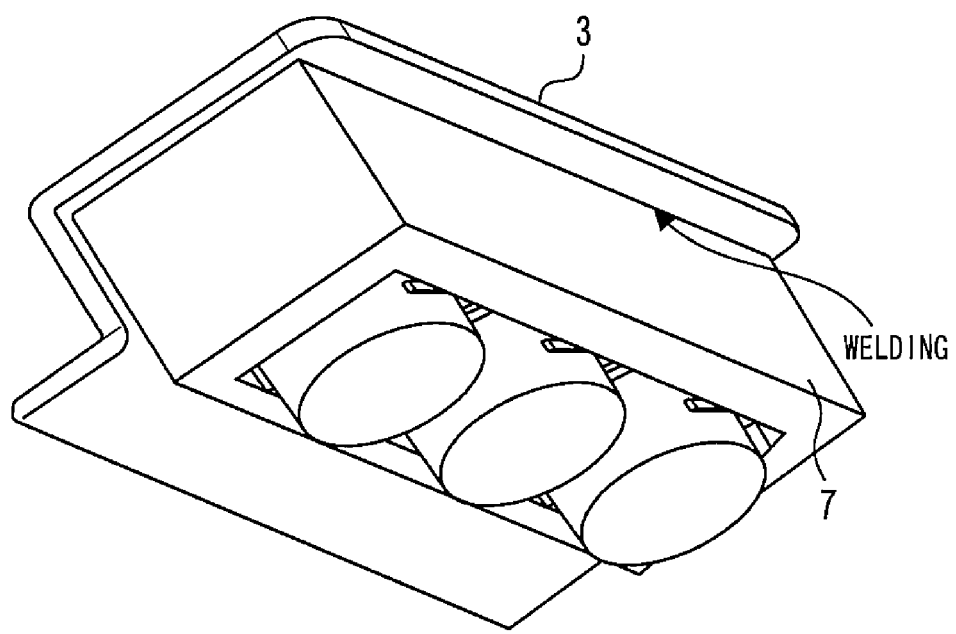

FIGS. 9 and 10 are perspective views of an electrode and a nut box according to Embodiment 5 of the present invention. In the present embodiment, the nut box 7 is fixed on the electrode 3 by being directly welded to the electrode 3. The need for a special structure on the electrode 3 side is thereby eliminated and the facility with which the electrodes 3 is worked is therefore improved. The force for holding the nut box 7 is improved by welding. In other respects, the construction and effects are the same as those of Embodiment 1.

DESCRIPTION OF SYMBOLS 1 semiconductor element; 2 wiring substrate; 3 electrode; 4 opening; 5 bent portion; 6 nut; 7 nut box; 8 case; 9 supporting portion; 10 indentation; 11,14 projection; 13 hole; 15 metal screw; 16 claw

The invention claimed is:

1. A semiconductor device comprising:
a wiring substrate;
an electrode having an opening and a bent portion and joined to the wiring substrate;
a nut box having a nut and inserted in the bent portion of the electrode so that the nut is positioned in alignment with the opening of the electrode; and
a case covering the wiring substrate,
wherein the nut box and the case are members separate from each other, and
the nut box is fixed in the electrode so as not to come off from the bent portion.

2. The semiconductor device of claim 1, wherein the electrode has a supporting portion for supporting the nut box,
an indentation is provided in the supporting portion,
the nut box has a projection, and
the nut box is fixed in the electrode by fitting the projection of the nut box in the indentation of the supporting portion.

3. The semiconductor device of claim 2, wherein a lead for leading the projection of the nut box into the indentation is provided in the supporting portion.

4. The semiconductor device of claim 1, wherein the electrode has a hole,
the nut box has a projection, and
the projection of the nut box is inserted in the hole in the electrode and molten and fixed on the electrode.

5. The semiconductor device of claim 1, wherein the nut box is fixed on the electrode with any one of a metal screw, a resin screw, and a snap-fit.

6. The semiconductor device of claim 1, wherein the nut box has a claw,
when the nut box is inserted in the bent portion of the electrode, the claw is deformed, and
the nut box is fixed on the electrode by reforming the claw after the nut box is inserted.

7. The semiconductor device of claim 1, wherein the nut box is directly welded to the electrode.

* * * * *